(12) United States Patent
Liu

(10) Patent No.: US 11,069,575 B2
(45) Date of Patent: Jul. 20, 2021

(54) SEMICONDUCTOR DEVICE AND MANUFACTURE THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Jiquan Liu, Shanghai (CN)

(73) Assignees: Semiconductor Manufacturing International (Shanghai) Corporation; Semiconductor Manufacturing International (Beijing) Corporation

( * ) Notice: Subject to any disclaimer, the term of this patent is extended or adjusted under 35 U.S.C. 154(b) by 94 days.

(21) Appl. No.: 16/109,435

(22) Filed: Aug. 22, 2018

(65) Prior Publication Data

US 2019/0067114 A1 Feb. 28, 2019

(30) Foreign Application Priority Data

Aug. 22, 2017 (CN) .......................... 201710722343.2

(51) Int. Cl.
*H01L 21/8234* (2006.01)
*H01L 29/78* (2006.01)
*H01L 29/66* (2006.01)
*H01L 29/417* (2006.01)
(Continued)

(52) U.S. Cl.
CPC ........ *H01L 21/823431* (2013.01); *H01L 21/76897* (2013.01); *H01L 21/823821* (2013.01); *H01L 29/41791* (2013.01); *H01L 29/66795* (2013.01); *H01L 29/785* (2013.01); *H01L 29/7848* (2013.01); *H01L 29/665* (2013.01)

(58) Field of Classification Search
CPC ................................................ H01L 21/823418
See application file for complete search history.

(56) References Cited

U.S. PATENT DOCUMENTS

| 5,591,672 A * | 1/1997 | Lee ................... H01L 21/76843 257/E21.584 |
| 2013/0069172 A1* | 3/2013 | Liao ................... H01L 29/7848 257/408 |

(Continued)

*Primary Examiner* — Julio J Maldonado
*Assistant Examiner* — Hajar Kolahdouzan
(74) *Attorney, Agent, or Firm* — Innovation Counsel LLP

(57) ABSTRACT

A semiconductor device and its manufacturing method are presented, relating to semiconductor technology. The manufacturing method comprises: providing a substrate structure comprising a substrate, a source region on the substrate, and a gate structure on the source region; forming cavities on two opposing sides of the gate structure; epitaxially growing electrodes in the cavities, with each electrode comprising an electrode body and an amorphous layer on the electrode body; forming an dielectric layer on the substrate structure covering the electrodes and the gate structure; etching the dielectric layer to form a contact hole exposing the amorphous layer; forming a conductive adhesive layer on the bottom and on the side of the contact hole; and forming a contact component on the conductive adhesive layer filling the contact hole. In this semiconductor device, the adhesive layer may be directly formed on the amorphous layer, resulting in improved performance of the device.

15 Claims, 13 Drawing Sheets

(51) Int. Cl.
*H01L 21/768* (2006.01)
*H01L 21/8238* (2006.01)

(56) References Cited

U.S. PATENT DOCUMENTS

| | | | |
|---|---|---|---|
| 2013/0071981 A1* | 3/2013 | Huang | H01L 21/28518 |
| | | | 438/301 |
| 2013/0207189 A1* | 8/2013 | Cheng | H01L 27/0883 |
| | | | 257/347 |
| 2014/0273386 A1* | 9/2014 | Tsao | H01L 21/76897 |
| | | | 438/301 |
| 2018/0174913 A1* | 6/2018 | More | H01L 29/45 |

\* cited by examiner

SEMICONDUCTOR DEVICE AND MANUFACTURE THEREOF

CROSS-REFERENCE TO RELATED APPLICATION

This application claims priority to and benefit of Chinese Patent Application No. 201710722343.2 filed on Aug. 22, 2017, which is incorporated herein by reference in its entirety.

BACKGROUND

(a) Field of the Invention

This inventive concept relates to semiconductor technology and, more specifically to a semiconductor device and its manufacturing method.

(b) Description of the Related Art

Reducing the size of a Metal-Oxide-Semiconductor Field-Effect Transistor (MOSFET) in an Integrated Circuit (IC) has long been an R&D focus in IC technology. Smaller MOSFET size helps to improve the integration level and lower the manufacture cost. However, it also leads to a "short channel effect" in the device. As the size of a MOSFET decreases, so does the effective length of its gate. Since the amount of charge carriers a gate voltage can control in a depletion layer is proportionally related to the length of the gate, a shorter gate results in less charge carriers in control, and thus a lower threshold voltage of the transistor. In a Fin Field-Effect Transistor (FinFET), the channel region is formed in a semiconductor fin, the source and the drain are formed on two sides of the semiconductor fin, and the gate (e.g., a dual gate structure) is formed on two sides of the channel region and surrounding the channel region. The channel region in the semiconductor fin can be made very thin to allow the gate have a good control over the entire channel region, thus the short channel effect can be inhibited.

In a semiconductor manufacturing process of 16 nm or below, a self-aligned silicide process (the "silicide process") is not a stand alone process. Instead, it is often incorporated into succeeding contact processes. In a contact process, an adhesive layer is typically made of titanium (Ti) and titanium nitride (TiN), therefore titanium-silicon (TiSi) need to be formed at the bottom of a contact, which is a challenge task due to the small size of a contact. In a conventional method to form TiSi at the bottom of a contact, an ion implantation will first be conducted to form an amorphous layer on the source and the drain before the adhesive layer is formed, so that the energy needed to form TiSi can be lowered. However, a contact typically has a small diameter and a large depth, this geometric can hinder the ion implantation process and result in in-homogeneous on the amorphous layer formed, which in turn affects the epitaxially growth of the electrodes on the source and the drain, and adversly affects the performance of the device.

SUMMARY

Based on the investigations on the limitations of conventional devices, this inventive concept presents a semiconductor device and its manufacturing method that remedy at least one limitation of the conventional device and manufacturing method.

This inventive concept first presents a semiconductor device manufacturing method, comprising:
  providing a substrate structure comprising:
  a substrate;
  a source region on the substrate; and
  a gate structure on the source region;
  forming cavities on two opposing sides of the gate structure;
  epitaxially growing electrodes in the cavities, with each electrode comprising an electrode body and an amorphous layer on the electrode body;
  forming a dielectric layer covering the electrodes and the gate structure on the substrate structure;
  etching the dielectric layer to form a contact hole exposing the amorphous layer;
  forming a conductive adhesive layer on the bottom and on the side of the contact hole; and
  forming a contact component filling the contact hole on the conductive adhesive layer.

Additionally, in the aforementioned method, the electrodes may comprise a source and a drain, the contact hole may comprise a first contact hole exposing the source and a second contact hole exposing the drain, and the contact component may comprise a first contact component filling the first contact hole and a second contact component filling the second contact hole. The source region may be a semiconductor fin, and the depth of each cavity may be in a range of 20 nm to 100 nm.

Additionally, in the aforementioned method, epitaxially growing electrodes in the cavities may comprise:
  epitaxially growing a seed layer in the cavities;
  epitaxially growing a body layer on the seed layer;
  epitaxially growing a cover layer on the body layer; and
  epitaxially growing the amorphous layer on the cover layer, wherein the seed layer, the body layer, and the cover layer constitute the electrode body.

Additionally, in the aforementioned method, the source region may be N type, and the electrodes may be made of silicon-germanium (SiGe). In the electrodes, the amorphous layer may have the highest germanium (Ge) concentration, and the seed layer and the cover layer may have the lowest Ge concentration. The seed layer may comprise 0-20% germanium (Ge), the body layer may comprise 30%-70% Ge, the cover layer may comprise 0-20% Ge, and the amorphous layer may comprise 60%-90% Ge.

Additionally, in the aforementioned method, the source region may be P type, and the electrodes may be made of silicon carbide (SiC) or silicon phosphide (SiP). The seed layer, the body layer, the cover layer, and the amorphous layer may be doped with germanium (Ge), carbon (C), or phosphorus (P). The amorphous layer may have the highest doping concentration of germanium, carbon, or phosphorus, and the seed layer and the cover layer may have the lowest doping concentration of germanium, carbon, or phosphorus.

Additionally, the aforementioned method may further comprise:
  after the conductive adhesive layer is formed, but before the contact component filling the contact hole is formed on the conductive adhesive layer, conducting an annealing process on the substrate structure. The annealing process may be conducted in a temperature range of 600° C.-1000° C.

Additionally, in the aforementioned method, the gate structure may comprise a gate dielectric layer on a portion of the source region and a gate on the gate dielectric layer.

Additionally, in the aforementioned method, etching the dielectric layer to form a contact hole exposing the amorphous layer may comprise:

etching the dielectric layer to form a connection hole exposing the gate, wherein forming a conductive adhesive layer on the bottom and on the side of the contact hole comprises:

forming a conductive adhesive layer on the bottom and on the side of the connection hole, and wherein forming a contact component filling the contact hole on the conductive adhesive layer comprises:

forming a connection component filling the connection hole on the conductive adhesive layer.

This inventive concept further presents a semiconductor device, comprising:

a substrate structure comprising:
a substrate;
a source region on the substrate; and
a gate structure on the source region;
cavities on two opposing sides of the gate structure;
electrodes in the cavities, wherein each electrode comprises an electrode body and an amorphous layer on the electrode body;
a dielectric layer on the substrate structure covering the electrodes and the gate structure;
a contact hole going through the dielectric layer and exposing the amorphous layer;
a conductive adhesive layer on the bottom and on the side of the contact hole; and
a contact component filling the contact hole on the conductive adhesive layer.

Additionally, in the aforementioned device, the electrodes may comprise a source and a drain, the contact hole may comprise a first contact hole exposing the source, and a second contact hole exposing the drain, and the contact component may comprise a first contact component filing the first contact hole, and a second contact component filling the second contact hole. The source region may be a semiconductor fin, the depth of each cavity may be in a range of 20 nm to 100 nm, and the electrode body may comprise a seed layer, a body layer on the seed layer, and a cover layer on the body layer.

Additionally, in the aforementioned device, the source region may be N type, and the electrodes may be made of silicon-germanium (SiGe). In the electrodes, the amorphous layer may have the highest germanium (Ge) concentration, and the seed layer and the cover layer may have the lowest Ge concentration. The seed layer may comprise 0-20% germanium (Ge), the body layer may comprise 30%-70% Ge, the cover layer may comprise 0-20% Ge, and the amorphous layer may comprise 60%-90% Ge.

Additionally, in the aforementioned device, the source region may be P type, and the electrodes may be made of silicon carbide (SiC) or silicon phosphide (SiP). The seed layer, the body layer, the cover layer, and the amorphous layer may be doped with germanium (Ge), carbon (C), or phosphorus (P). The amorphous layer may have the highest doping concentration of germanium, carbon, or phosphorus, and the seed layer and the cover layer may have the lowest doping concentration of germanium, carbon, or phosphorus.

Additionally, in the aforementioned device, the gate structure may comprise a gate dielectric layer on a portion of the source region and a gate on the gate dielectric layer.

Additionally, the aforementioned device may further comprise:

a connection hole going through the dielectric layer and exposing the gate;

a conductive adhesive layer on the bottom and on the side of the connection hole; and a connection component filling the connection hole on the conductive adhesive layer.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION OF THE EMBODIMENTS

Figure 1:
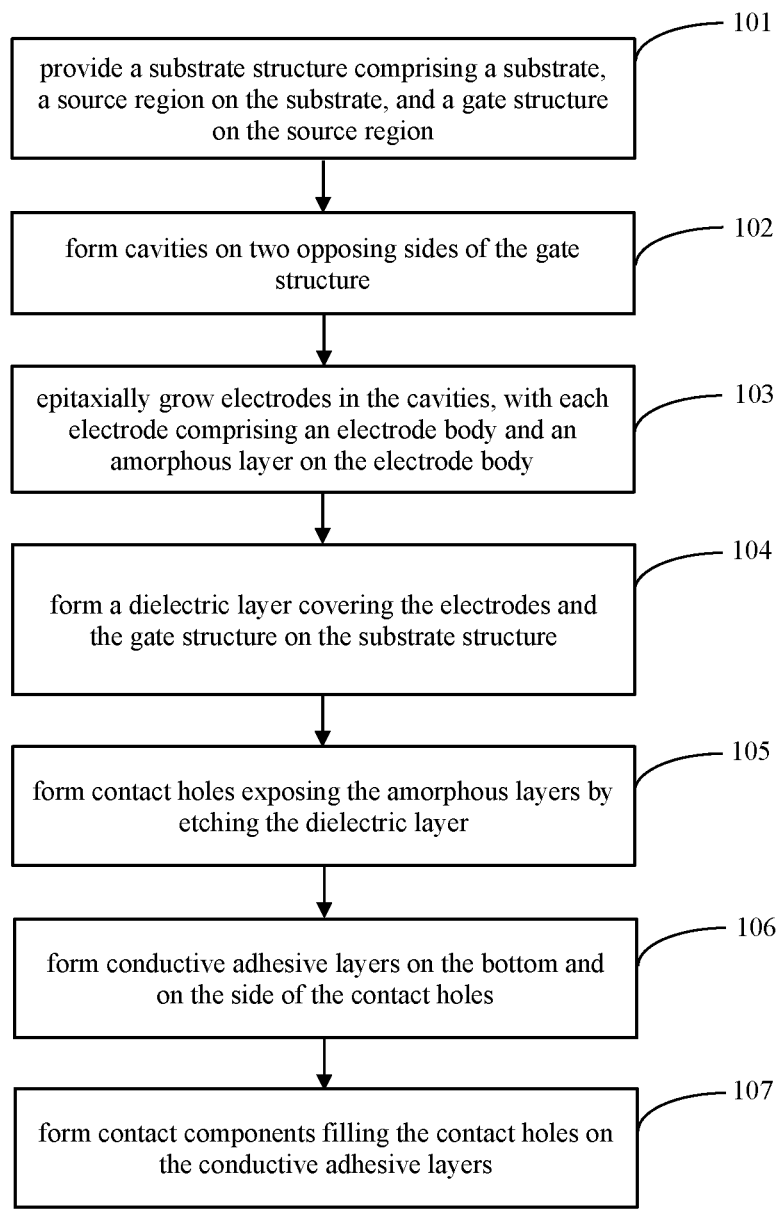
FIG. 1 shows a flowchart illustrating a semiconductor device manufacturing method in accordance with one embodiment of this inventive concept.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

FIG. 1 shows a flowchart illustrating a semiconductor device manufacturing method in accordance with one embodiment of this inventive concept. Referring to FIG. 1, this manufacturing method comprises the following steps.

In step 101, a substrate structure is provided, the substrate structure may comprise a substrate, a source region on the substrate, and a gate structure on the source region. The source region may be a semiconductor fin.

Optionally, the gate structure may comprise a gate dielectric layer on a portion of the source region, and a gate on the gate dielectric layer.

In step 102, cavities are formed on two opposing sides of the gate structure. Optionally, the depth of each cavity may be in a range of 20 nm to 100 nm.

In step 103, electrodes are epitaxially grown in the cavities. The electrodes may comprise a source and a drain, and each electrode may comprise an electrode body and an amorphous layer on the electrode body.

Optionally, epitaxially growing the electrodes in the cavities may comprise: epitaxially growing a seed layer in a cavity; epitaxially growing a body layer on the seed layer; epitaxially growing a cover layer on the body layer; and epitaxially growing the amorphous layer on the cover layer. The seed layer, the body layer, and the cover layer constitute the electrode body.

If the source region is N type (i.e., the transistor is a PMOS transistor), the electrodes may be made of silicon-germanium (SiGe). Optionally, in each electrode, the amorphous layer may have the highest germanium (Ge) concentration, and the seed layer and the cover layer may have the lowest Ge concentration. For example, the seed layer may comprise 0-20% Ge, the body layer may comprise 30%-70% Ge, the cover layer may comprise 0-20% Ge, and the amorphous layer may comprise 60%-90% Ge.

If the source region is P type (i.e., the transistor is an NMOS transistor), the electrodes may be made of silicon carbide (SiC) or silicon phosphide (SiP). Optionally, the seed layer, the body layer, the cover layer, and the amorphous layer may be doped with Ge, carbon (C), or phosphorus (P). The amorphous layer may have the highest doping concentration of Ge, C, or P, and the seed layer and the cover layer may have the lowest doping concentration of Ge, C, or P.

In step 104, a dielectric layer covering the electrodes and the gate structure may be formed on the substrate structure.

In step 105, a contact hole exposing the amorphous layer may be formed by etching the dielectric layer. Optionally, the contact hole may comprise a first contact hole exposing the source, and a second contact hole exposing the drain.

In step 106, a conductive adhesive layer may be formed on the bottom and on the side of the contact hole.

In step 107, a contact component filling the contact hole may be formed on the conductive adhesive layer. Optionally, the contact component may comprise a first contact component filling the first contact hole, and a second contact component filling the second contact hole.

Optionally, this manufacturing method may further comprise: after the conductive adhesive layer is formed, but before the contact component filling the contact hole is formed on the conductive adhesive layer, conducting an annealing process on the substrate structure. The annealing process may be conducted in a temperature range of 600° C.-1000° C., so that titanium-silicon (TiSi) may be formed on the bottom of the contact hole.

In this inventive concept, the electrodes comprise an amorphous layer, on which the adhesive layer may be directly formed, it improves the silicide process and in turn the performance of the resulting device.

Figure 2:
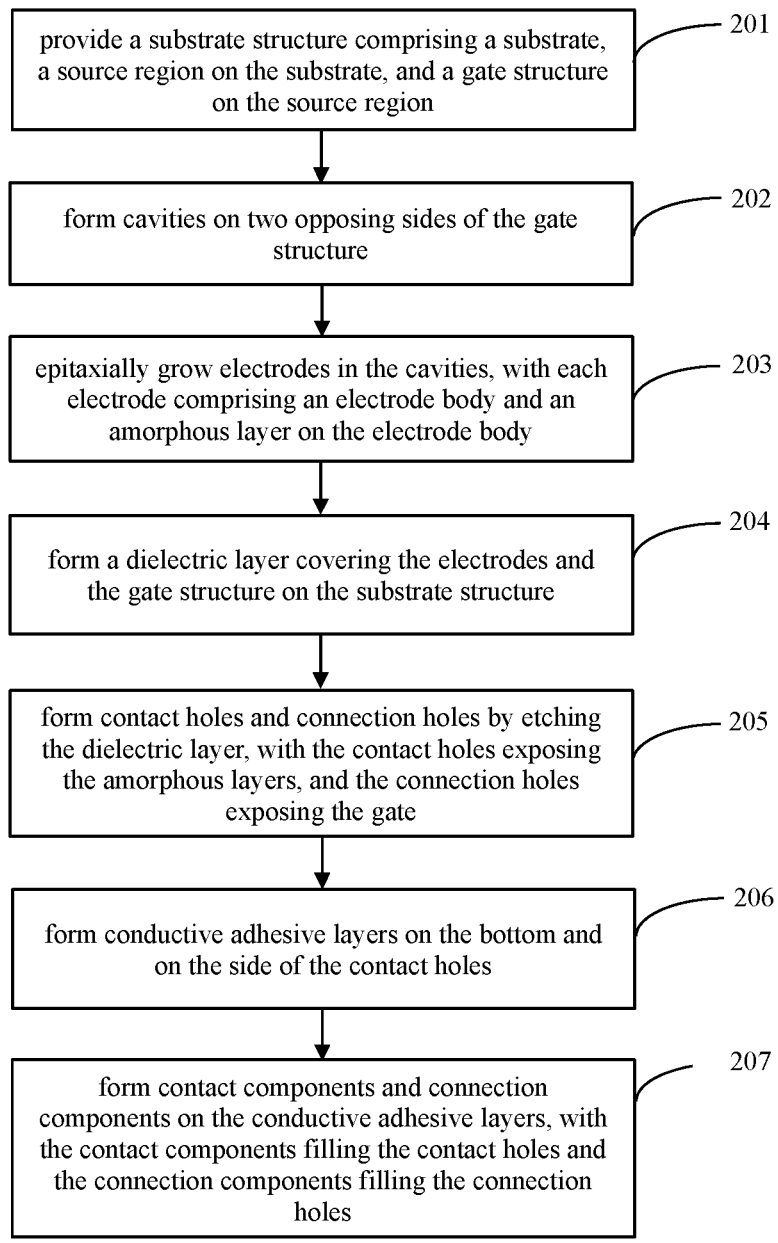
FIG. 2 shows a flowchart illustrating a semiconductor device manufacturing method in accordance with another embodiment of this inventive concept.

FIG. 2 shows a flowchart illustrating a semiconductor device manufacturing method in accordance with another embodiment of this inventive concept. Referring to FIG. 2, this manufacturing method may comprise the following steps.

In step 201, a substrate structure is provided. The substrate structure may comprise a substrate, a source region on the substrate, and a gate structure on the source region. The source region may be a semiconductor fin.

Optionally, the gate structure may comprise a gate dielectric layer on a portion of the source region, and a gate on the gate dielectric layer.

In step 202, cavities are formed on two opposing sides of the gate structure. Optionally, the depth of each cavity may be in a range of 20 nm to 100 nm.

In step 203, electrodes are epitaxially grown in the cavities. The electrodes may comprise a source and a drain, each electrode may comprise an electrode body and an amorphous layer on the electrode body.

Optionally, epitaxially growing the electrodes in the cavities may comprise: epitaxially growing a seed layer in the cavity; epitaxially growing a body layer on the seed layer; epitaxially growing a cover layer on the body layer; and epitaxially growing the amorphous layer on the cover layer. The seed layer, the body layer, and the cover layer constitute the electrode body.

If the source region is N type (i.e., the transistor is a PMOS transistor), the electrodes may be made of SiGe. Optionally, in each electrode, the amorphous layer may have the highest Ge concentration, and the seed layer and the cover layer may have the lowest Ge concentration. For example, the seed layer may comprise 0-20% Ge, the body layer may comprise 30%-70% Ge, the cover layer may comprise 0-20% Ge, and the amorphous layer may comprise 60%-90% Ge.

If the source region is P type (i.e., the transistor is an NMOS transistor), the electrodes may be made of SiC or SiP. Optionally, the seed layer, the body layer, the cover layer, and the amorphous layer may be doped with Ge, C, or P. The amorphous layer may have the highest doping concentration of Ge, C, or P, and the seed layer and the cover layer may have the lowest doping concentration of Ge, C, or P.

In step 204, a dielectric layer covering the electrodes and the gate structure may be formed on the substrate structure.

In step 205, a contact hole exposing the amorphous layer and a connection hole exposing the gate may be formed by etching the dielectric layer. Optionally, the contact hole may comprise a first contact hole exposing the source, and a second contact hole exposing the drain.

In step 206, a conductive adhesive layer may be formed on the bottom and on the side of the contact hole.

In step 207, a contact component filling the contact hole and a connection component filling the connection hole may be formed on the conductive adhesive layer. Optionally, the contact component may comprise a first contact component filling the first contact hole, and a second contact component filling the second contact hole.

Optionally, this manufacturing method may further comprise: after the conductive adhesive layer is formed, but before the contact component filling the contact hole is formed on the conductive adhesive layer, conducting an annealing process on the substrate structure. The annealing process may be conducted in a temperature range of 600° C.-1000° C., so that TiSi may be formed on the bottom of the contact hole.

Details of the manufacturing method of this inventive concept are described below with reference to an example.

Figure 3A:
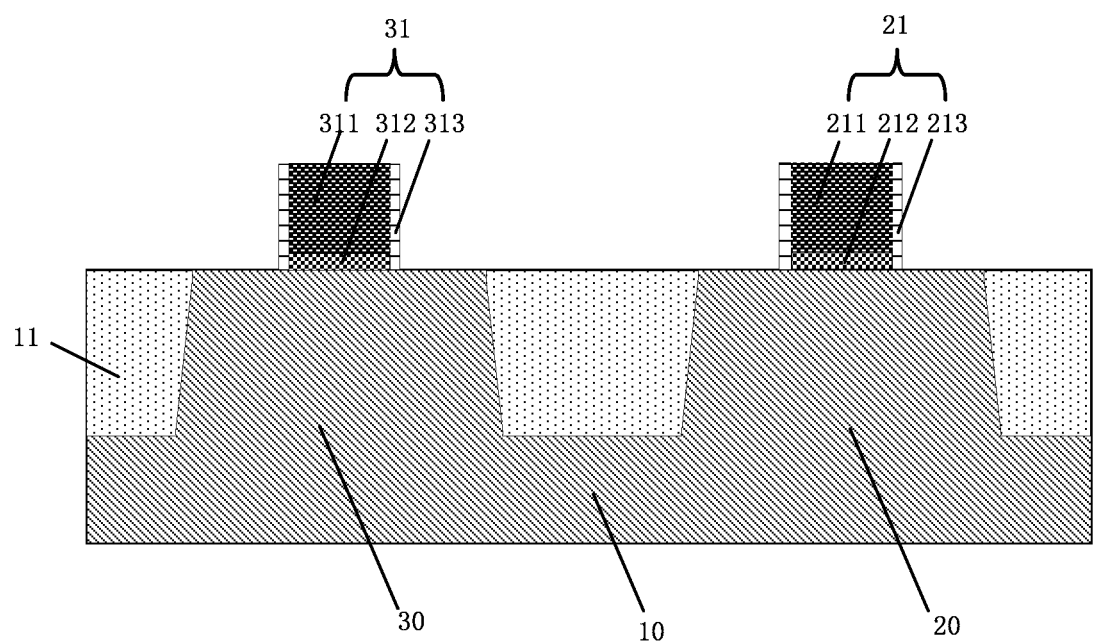
FIGS. 3A, 3B, 3C, 3D, 3E, 3F, 3G 3H, 3I, 3J, 3K, 3L, 3M show diagrams illustrating different stages of a semiconductor device manufacturing method in accordance with one embodiment of this inventive concept.

Referring to FIG. 3A, the substrate structure may comprise a substrate 10, a first source region 20 and a second source region 30 on the substrate 10, a first gate structure 21 on the first source region 20, and a second gate structure 31 on the second source region 30. Additionally, the substrate 10 may comprise a dielectric layer 11, and the first source region 20 and the second source regions 30 may each be a semiconductor fin.

Among the two source regions (20 and 30) presented in this example, one of them (e.g., the first source region 20) may be used for a PMOS transistor, and the other (e.g., the second source region 30) may be used for a NMOS transistor.

The first gate structure 21 may comprise a gate dielectric layer 212 on a portion of the first source region 20, and a gate 211 on the gate dielectric layer 212. Additionally, the gate structure 21 may further comprise spacers 213. Similar to the first gate structure 21, the second gate structure 31 may comprise a gate dielectric layer 312 on a portion of the second source region 30, and a gate 311 on the gate dielectric layer 312. Additionally, the second gate structure 31 may further comprise spacers 313.

Figure 3B:
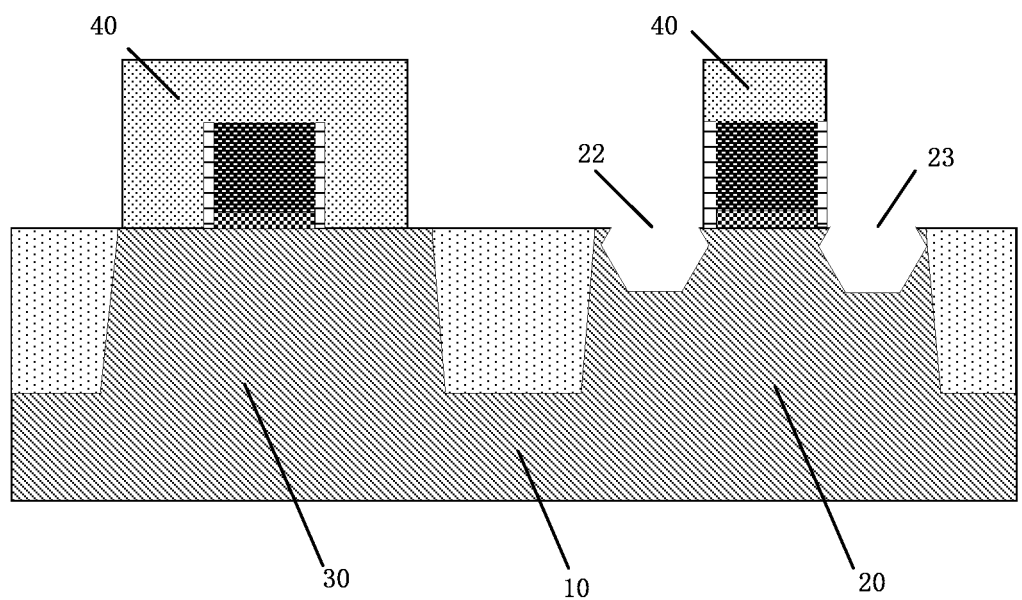

Referring to FIG. 3B, a patterned first mask 40 may be formed on the substrate structure, then two cavities 22 and 23, each on a side of the first gate structure 21, may be formed by etching. The depth of each cavity may be in a range of 20 nm to 100 nm.

Figure 3C:
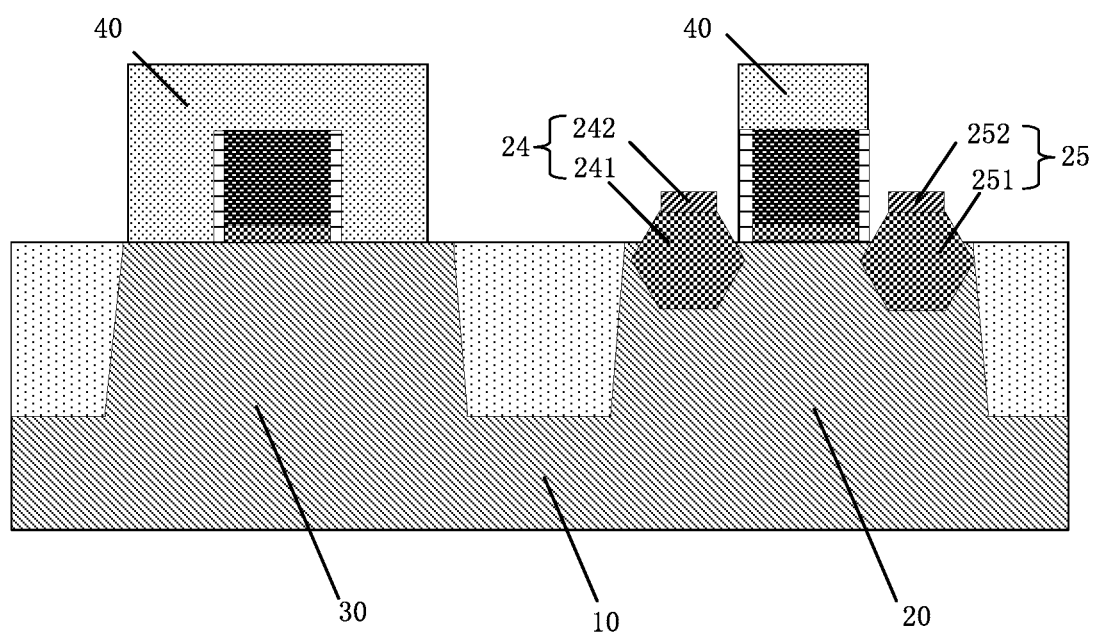

Referring to FIG. 3C, electrodes may be epitaxially grown in the cavities 22 and 23. A source 24 may be epitaxially grown in the cavity 22, and a drain 25 may be epitaxially grown in the cavity 23. The source 24 may comprise an electrode body 241 and an amorphous layer 242 on the electrode body 241, the drain 25 may comprise an electrode body 251 and an amorphous layer 252 on the electrode body 251.

Optionally, epitaxially growing an electrode in the cavity may comprise: epitaxially growing a seed layer in the cavity, epitaxially growing a body layer on the seed layer, epitaxially growing a cover layer on the body layer, and epitaxially growing an amorphous layer on the cover layer. The seed layer, the body layer, and the cover constitute an electrode body.

The source region 20 may be N type, corresponding to a PMOS transistor, and the source 24 and the drain 25 may be made of SiGe.

In the source 24 and the drain 25, the amorphous layer may have the highest Ge concentration, and the seed layer and the cover layer may have the lowest Ge concentration. Optionally, the seed layer may comprise 0-20% Ge, the body layer may comprise 30%-70% Ge, the cover layer may comprise 0-20% Ge, and the amorphous layer may comprise 60%-90% Ge.

Figure 3D:
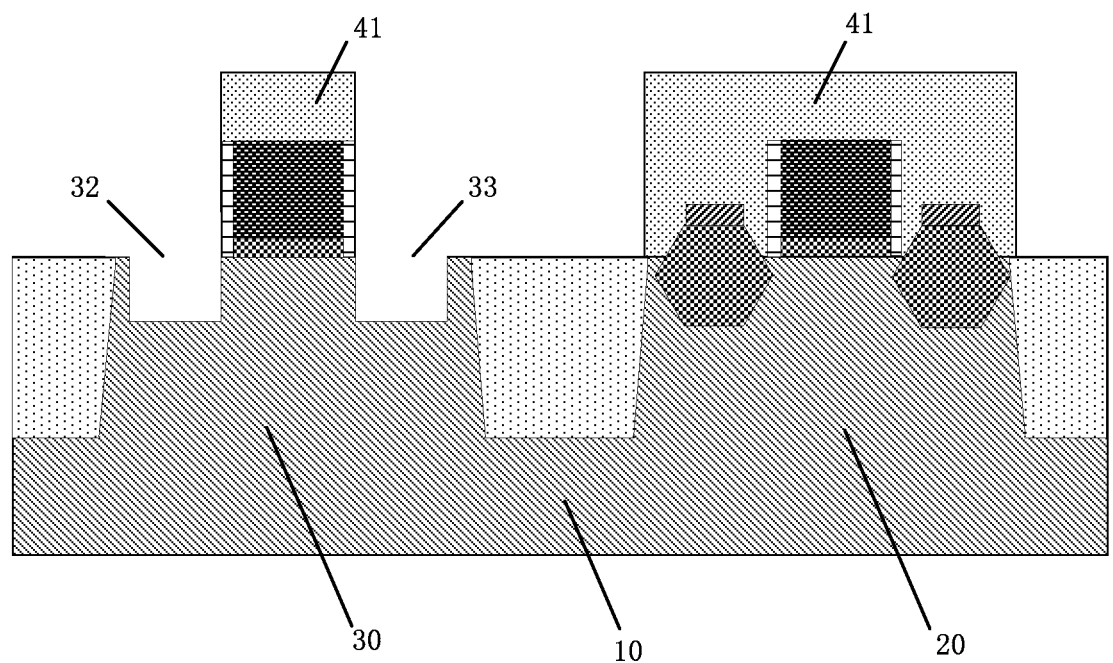
Figure 3E:
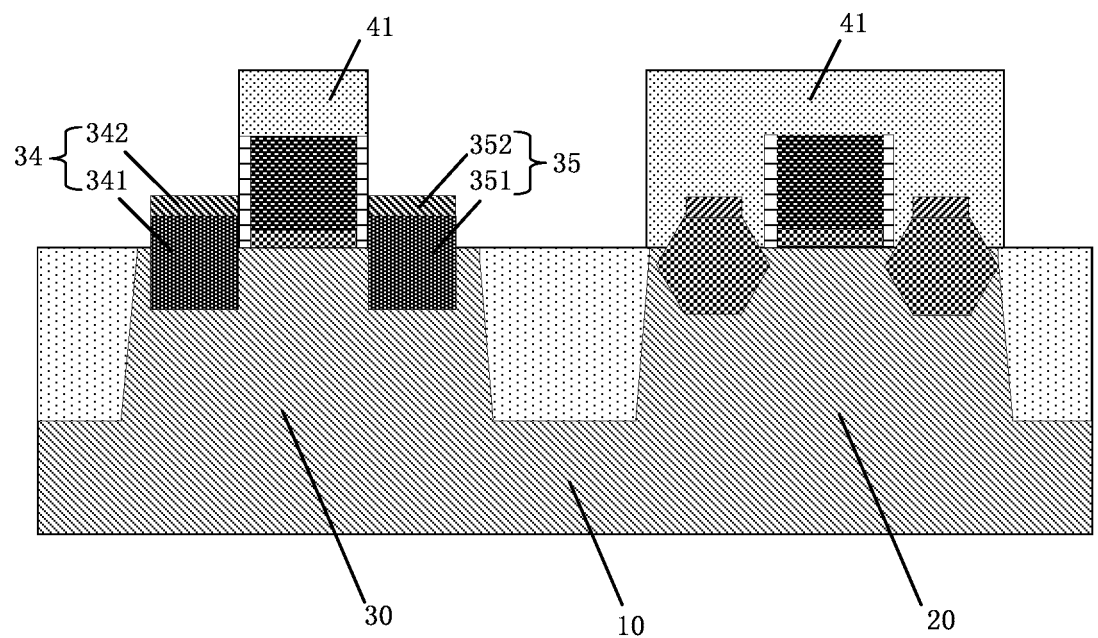

Referring to FIG. 3D, the first mask 40 maybe removed, then a patterned second mask 41 may be formed on the substrate structure. Two cavities 32 and 33, each on a side of the second gate structure 31, may be formed by etching. The depth of each cavity may be in a range of 20 nm to 100 nm. Referring to FIG. 3E, electrodes may be epitaxially grown in the cavities 32 and 33. A source 34 may be epitaxially grown in the cavity 32, and a drain 35 may be epitaxially grown in the cavity 33. The source 34 may comprise an electrode body 341 and an amorphous layer 342 on the electrode body 341, the drain 35 may comprise an electrode body 351 and an amorphous layer 352 on the electrode body 351.

Optionally, epitaxially growing an electrode in the cavity may comprise: epitaxially growing a seed layer in the cavity, epitaxially growing a body layer on the seed layer, epitaxially growing a cover layer on the body layer, and epitaxially growing an amorphous layer on the cover layer. The seed layer, the body layer, and the cover constitute an electrode body.

The source region 30 may be P type, corresponding to an NMOS transistor, and the source 34 and the drain 35 may be made of SiC or SiP.

In the source 34 and the drain 35, the seed layer, the body layer, the cover layer, and the amorphous layer may be doped with Ge, C, or P. The amorphous layer may have the highest doping concentration of Ge, C, or P, and the seed layer and the cover layer may have the lowest doping concentration of Ge, C, or P.

Figure 3F:
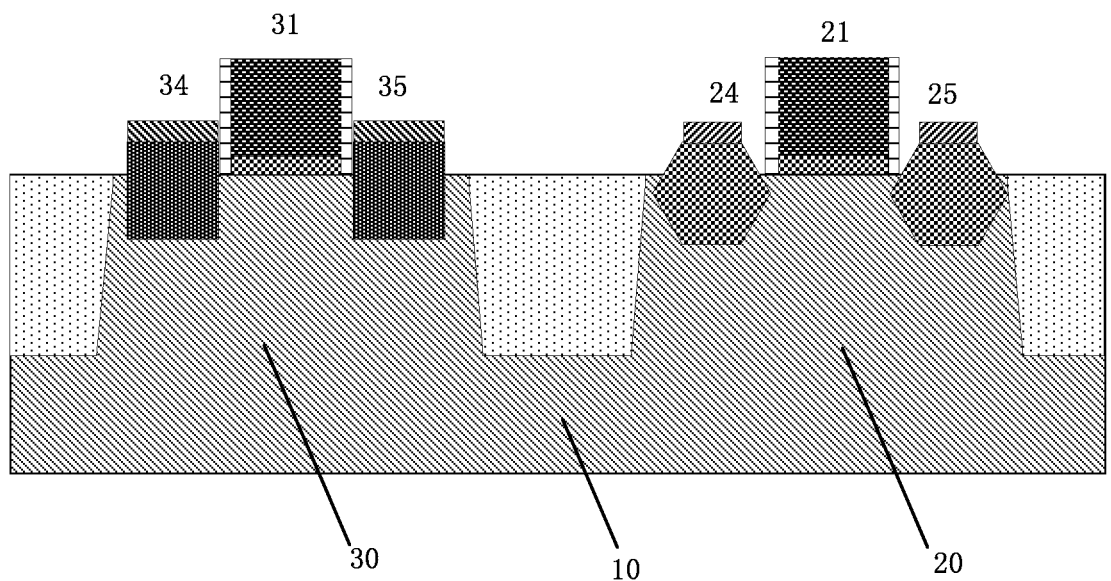

Referring to FIG. 3F, the second mask 41 is removed, and the sources 24 and 34, and the drains 25 and 35 become exposed.

Figure 3G:
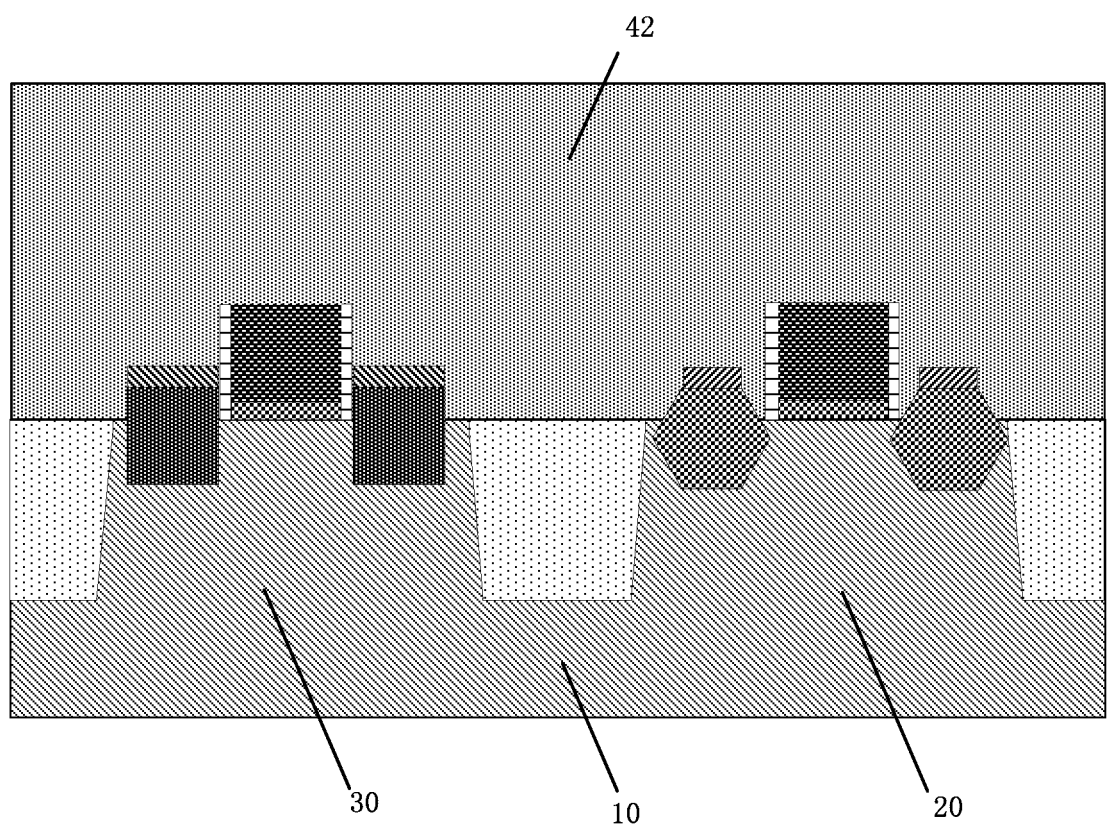

Referring to FIG. 3G a dielectric layer 42 is formed on the substrate structure to cover the sources 24 and 34, the drains 25 and 35, the first gate structures 21, and the second gate structure 31.

Figure 3H:
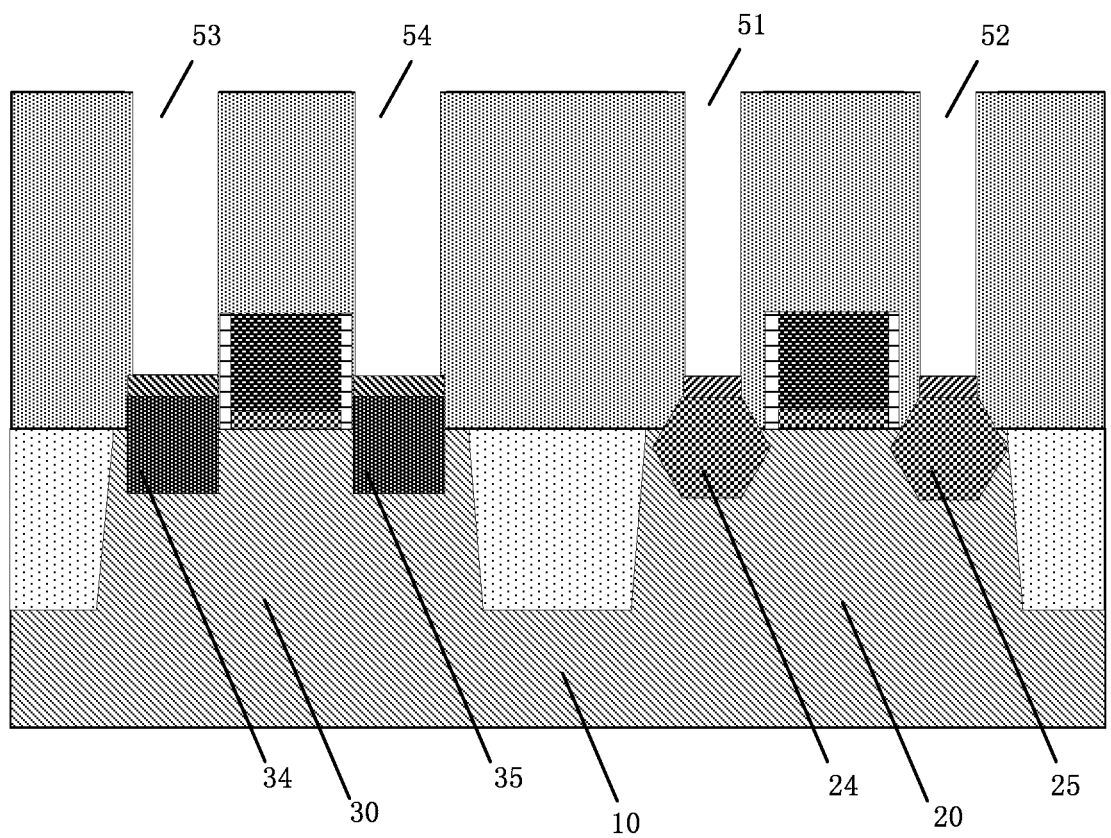

Referring to FIG. 3H, several contact holes exposing the amorphous layer may be formed by etching the dielectric layer 42. These contact holes may include a first contact hole 51 exposing the amorphous layer of the source 24, a second contact hole 52 exposing the amorphous layer of the drain 25, a third contact hole 53 exposing the amorphous layer of the source 34, and a fourth contact hole 54 exposing the amorphous layer of the drain 35.

Figure 3I:
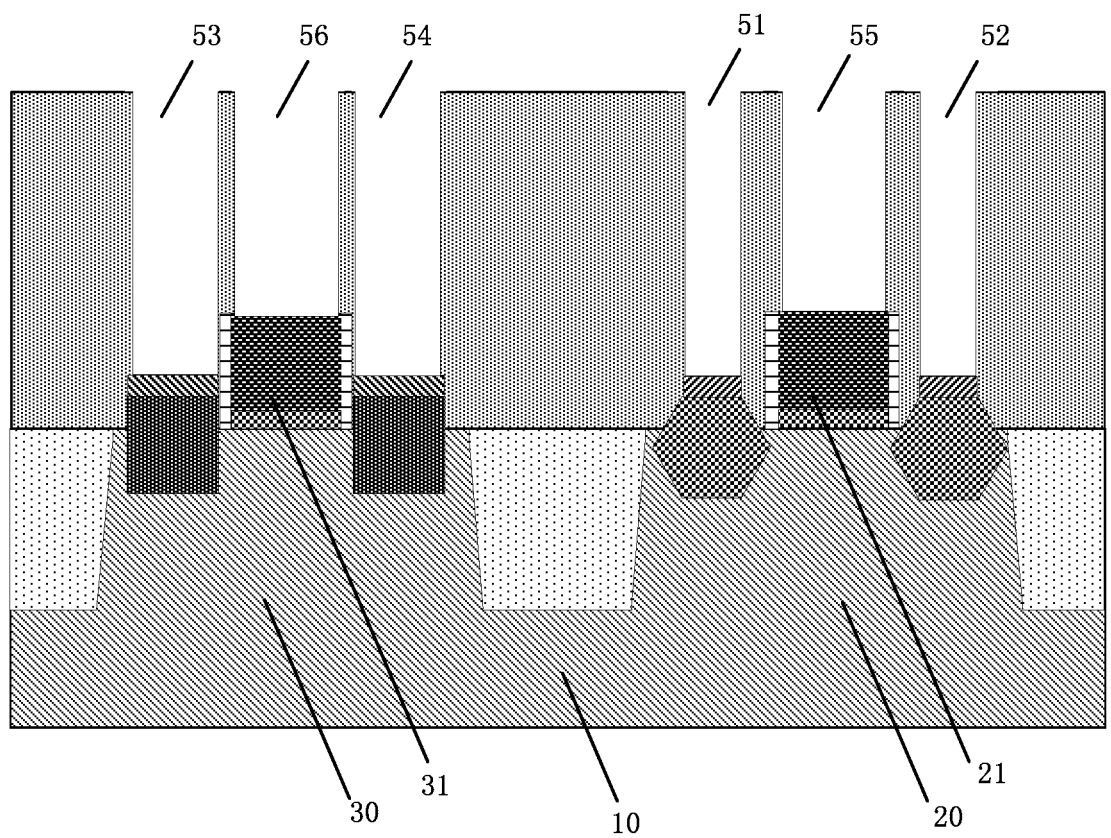

Referring to FIG. 3I, a first connection hole 55 exposing the first gate structure 21 and a second connection hole 56 exposing the second gate structure 31 may be formed by etching the dielectric layer 42.

Figure 3J:
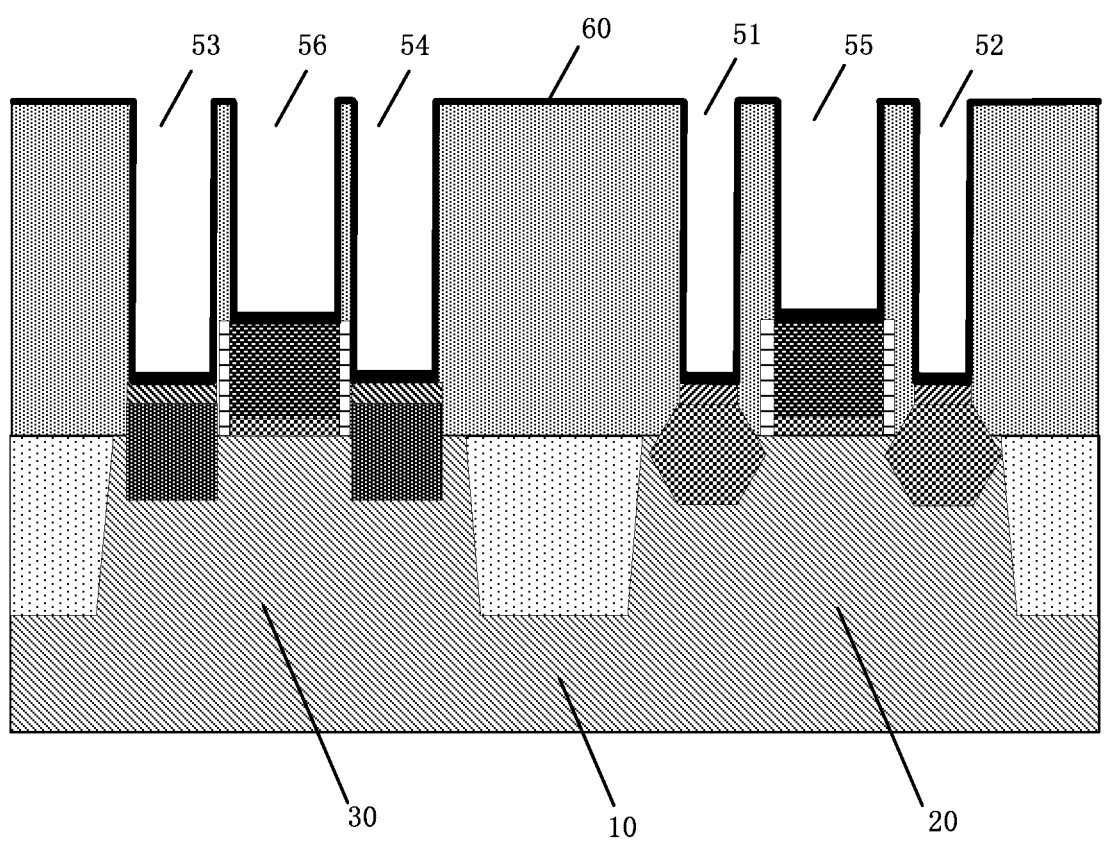

Referring to FIG. 3J, a conductive adhesive layer 60 may be formed on the bottom and on the side of four contact holes (51, 52, 53, and 54) and two connection holes (55 and 56). The conductive adhesive layer 60 may comprise titanium and titanium nitride (TiN).

Figure 3K:
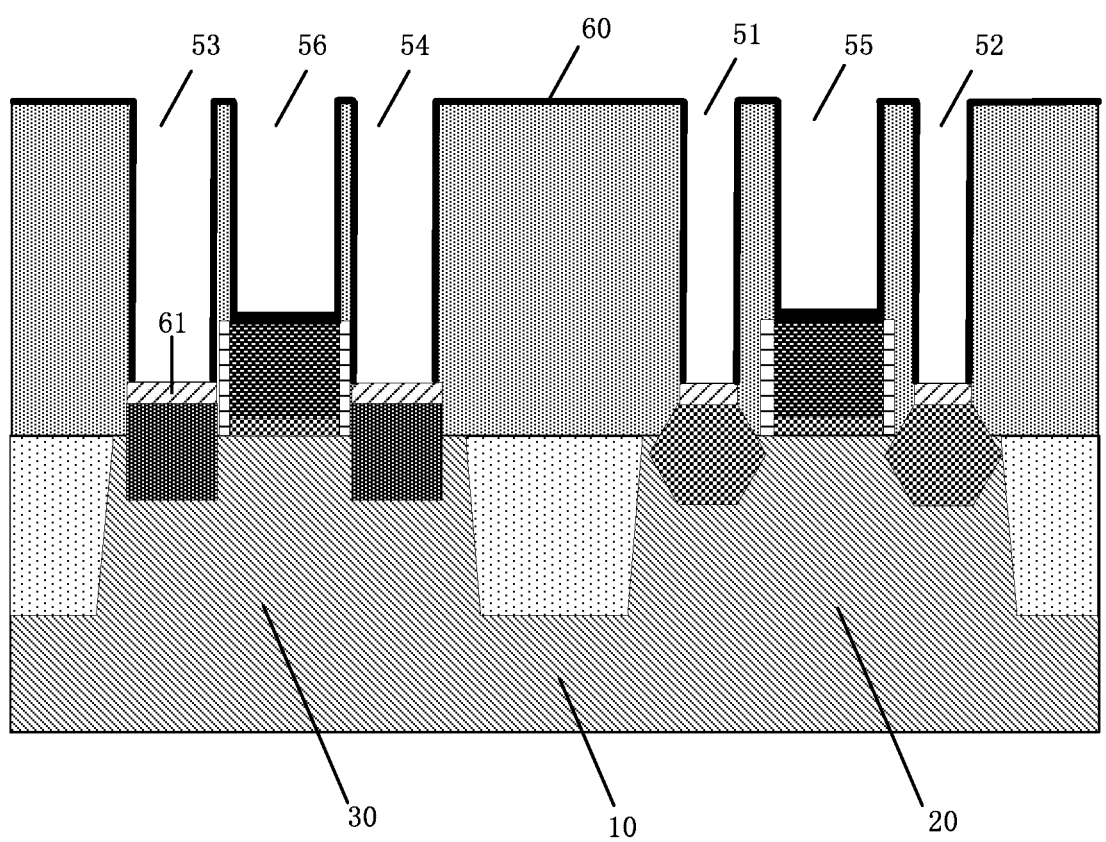

Referring to FIG. 3K, after the conductive adhesive layer 60 is formed, an annealing process, which may be conducted in a temperature range of 600° C. to 1000° C., may be applied on the substrate structure. Through the annealing process, a TiSi layer 61 may be formed on the bottom of four contact holes (51, 52, 53, and 54).

Figure 3L:
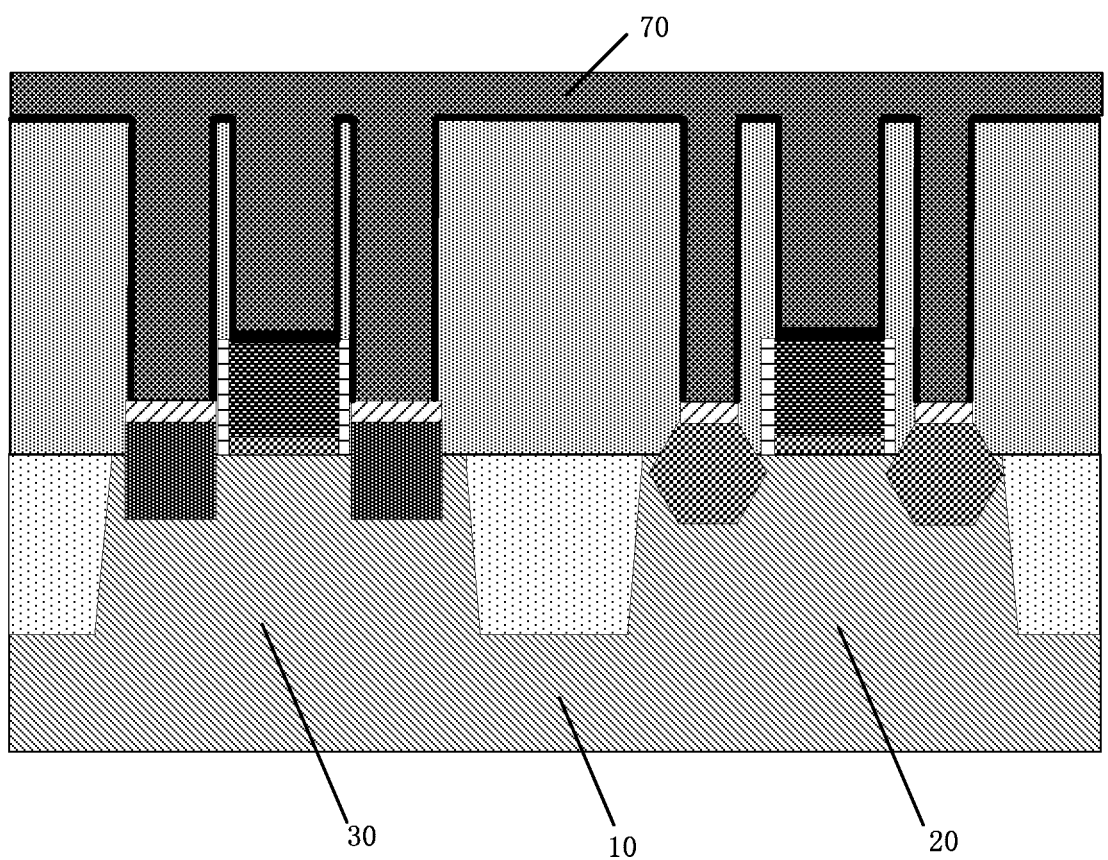

Referring to FIG. 3L, a conductive material layer 70 filling four contact holes (51, 52, 53, and 54) and two connection holes (55 and 56) may be formed.

Figure 3M:
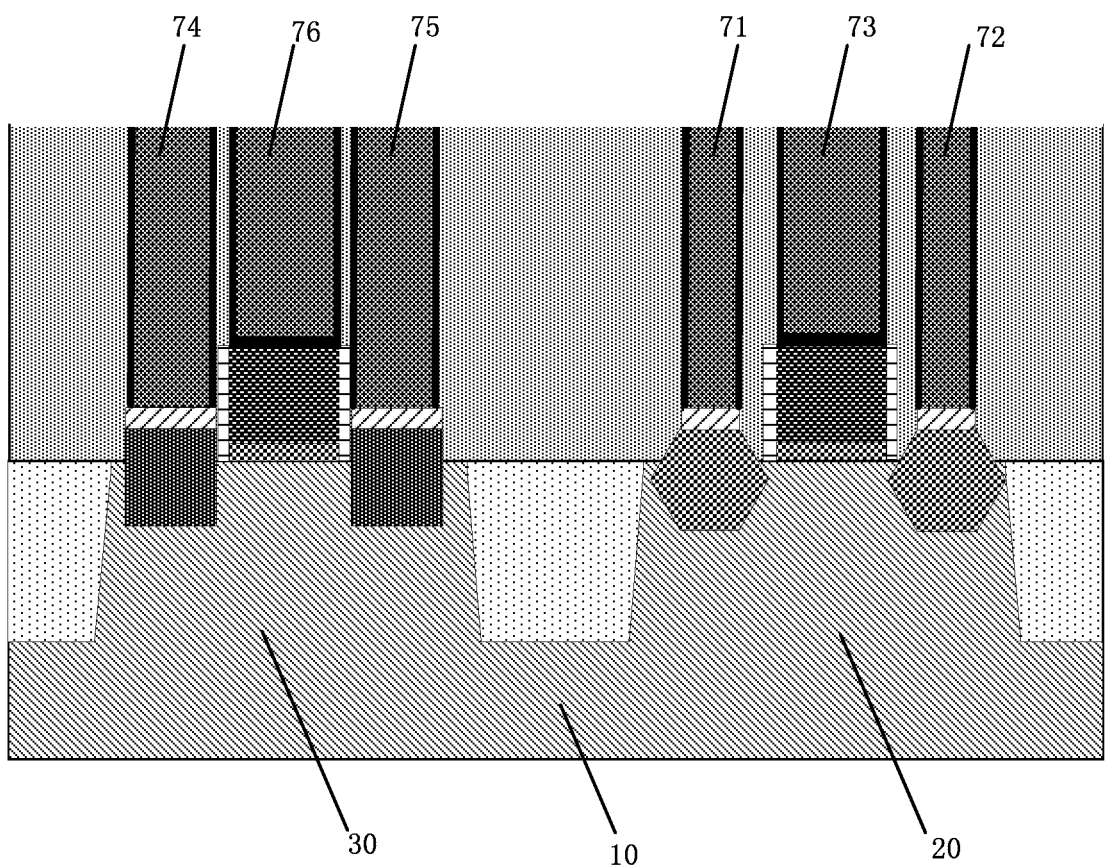

Referring to FIG. 3M, a Chemical Mechanical Planarization (CMP) process may be conducted on the conductive material layer 70 to form a first contact component 71 corresponding to the source 24, a second contact component 72 corresponding to the drain 25, a third contact component 74 corresponding to the source 34, a fourth contact component 75 corresponding to the drain 35, a first connection component 73 corresponding to the first gate structure 21, and a second connection component 76 corresponding to the second gate structure 31.

This inventive concept further presents a semiconductor device. Referring to FIG. 3M, the semiconductor device may comprise: a substrate structure comprising a substrate, a source region on the substrate, and a gate structure on the source region; cavities on two opposing sides of the gate structure, electrodes in the cavities with each electrode comprising an electrode body and an amorphous layer on the electrode body; a dielectric layer covering the electrodes and the gate structure on the substrate structure; contact holes going through the dielectric layer and exposing the amorphous layers; conductive adhesive layers on the bottom and on the side of the contact holes; and contact components filling the contact holes on the conductive adhesive layer.

Referring to FIG. 3M, the source region in this semiconductor device may be a semiconductor fin, the depth of each cavity may be in a range of 20 nm to 100 nm.

Additionally, the electrodes may comprise a source and a drain, the contact holes may comprise a first contact hole exposing the source and a second contact hole exposing the drain, the contact components may comprise a first contact component filling the first contact hole and a second contact component filling the second contact hole.

In one embodiment, the electrode body may comprise a seed layer, a body layer on the seed layer, and a cover layer on the body layer.

If the source region is N type, the electrodes may be made of SiGe. Optionally, in each electrode, the amorphous layer may have the highest Ge concentration, and the seed layer and the cover layer may have the lowest Ge concentration. For example, the seed layer may comprise 0-20% Ge, the body layer may comprise 30%-70% Ge, the cover layer may comprise 0-20% Ge, and the amorphous layer may comprise 60%-90% Ge.

If the source region is P type, the electrodes may be made of SiC or SiP. Optionally, the seed layer, the body layer, the cover layer, and the amorphous layer may be doped with Ge, C, or P. The amorphous layer may have the highest doping concentration of Ge, C, or P, and the seed layer and the cover layer may have the lowest doping concentration of Ge, C, or P.

Referring to FIG. 3M, the gate structure may comprise a gate dielectric layer on a portion of the source region and a gate on the gate dielectric layer.

Optionally, this semiconductor device may further comprise connection holes going through the dielectric layer and exposing the gate structure, conductive adhesive layers on the bottom and on the side of the connection holes, and connection components filling the connection holes on the conductive adhesive layers.

In this inventive concept, each electrode comprises an amorphous layer, on which the adhesive layer may be directly formed, thus Ti or TiN may be formed on the bottom of the contact holes through an annealing process, it improves the silicide process and the performance of the resulted device.

Additionally, in this inventive concept, conductive adhesive layers are formed on the bottom and on the side of the contact holes that go through the dielectric layer and expose the electrodes, the conductive adhesive layers prevent the oxidation of the electrode in the source region when forming the contact components, and thus effectively reduce the contact resistance and barrier height of the semiconductor device.

This concludes the description of a semiconductor device and its manufacturing method in accordance with one or more embodiments of this inventive concept. For the purpose of conciseness and convenience, some components or procedures that are well known to one of ordinary skill in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A semiconductor device manufacturing method, comprising:
   providing a substrate structure that comprises a substrate, a source region on the substrate, and a gate structure on the source region;
   forming cavities on two opposing sides of the gate structure;
   forming electrodes that are at least partially positioned in the cavities, with forming each of the electrodes comprising: forming an electrode body that has an outer surface and subsequently forming an amorphous layer on the outer surface of the electrode body;
   forming a dielectric layer covering the electrodes and the gate structure on the substrate structure;
   after the amorphous layer has been formed, etching the dielectric layer to form a contact hole exposing the amorphous layer;
   forming a conductive adhesive layer on a side of the contact hole, wherein the conductive adhesive layer exposes a face of the amorphous layer; and
   forming a contact component in the contact hole and on the conductive adhesive layer, wherein the contact component directly contacts the face of the amorphous layer.

2. The method of claim 1, wherein the electrodes comprise a source and a drain, the contact hole comprises a first contact hole exposing the source and a second contact hole exposing the drain, and the contact component comprises a first contact component filling the first contact hole and a second contact component filling the second contact hole.

3. The method of claim 1, wherein the source region is a semiconductor fin.

4. The method of claim 1, wherein the depth of each cavity is in a range of 20 nm to 100 nm.

5. The method of claim 1, wherein formation of the electrodes comprises: epitaxially growing a seed layer in each of the cavities; epitaxially growing a body layer on the seed layer; epitaxially growing a cover layer on the body layer; and epitaxially growing the amorphous layer on the cover layer, wherein the seed layer, the body layer, and the cover layer constitute the electrode body.

6. The method of claim 5, wherein the source region is N type, and the electrodes are made of silicon-germanium (SiGe).

7. A semiconductor device manufacturing method, comprising:
   providing a substrate structure that comprises a substrate, a source region on the substrate, and a gate structure on the source region;
   forming cavities on two opposing sides of the gate structure;
   forming electrodes that are at least partially positioned in the cavities, with forming each of the electrodes comprising: forming an electrode body that has an outer surface and subsequently forming an amorphous layer on the outer surface of the electrode body;
   forming a dielectric layer covering the electrodes and the gate structure on the substrate structure;
   after the amorphous layer has been formed, etching the dielectric layer to form a contact hole exposing the amorphous layer;
   forming a conductive adhesive layer on a side of the contact hole; and
   forming a contact component in the contact hole and on the conductive adhesive layer,
   wherein formation of the electrodes comprises: epitaxially growing a seed layer in each of the cavities; epitaxially growing a body layer on the seed layer; epitaxially growing a cover layer on the body layer; and epitaxially growing the amorphous layer on the cover layer, wherein the seed layer, the body layer, and the cover layer constitute the electrode body, and wherein in the electrodes, the amorphous layer has the highest germanium (Ge) concentration, and the seed layer and the cover layer have the lowest Ge concentration.

8. The method of claim 7, wherein the seed layer comprises 0-20% germanium (Ge), the body layer comprises 30%-70% Ge, the cover layer comprises 0-20% Ge, and the amorphous layer comprises 60%-90% Ge.

9. The method of claim 5, wherein the source region is P type, and the electrodes are made of silicon carbide (SiC) or silicon phosphide (SiP).

10. The method of claim 9, wherein the seed layer, the body layer, the cover layer, and the amorphous layer are doped with germanium (Ge), carbon (C), or phosphorus (P).

11. The method of claim 10, wherein the amorphous layer has the highest doping concentration of germanium, carbon, or phosphorus, and the seed layer and the cover layer have the lowest doping concentration of germanium, carbon, or phosphorus.

12. The method of claim 1, further comprising: after the conductive adhesive layer is formed, but before the contact component filling the contact hole is formed on the conductive adhesive layer, conducting an annealing process on the substrate structure.

13. The method of claim 12, wherein the annealing process is conducted in a temperature range of 600° C.-1000° C.

14. The method of claim 1, wherein the gate structure comprises a gate dielectric layer on a portion of the source region and a gate on the gate dielectric layer.

15. The method of claim 14, comprising: etching the dielectric layer to form a connection hole exposing the gate; forming a conductive layer on a side of the connection hole; and forming a connection component in the connection hole and on the conductive layer.

* * * * *